(12) United States Patent  
Gould et al.

(10) Patent No.: US 12,038,777 B2  
(45) Date of Patent: Jul. 16, 2024

(54) FAST PREDICTION PROCESSOR

(71) Applicant: Lightmatter, Inc., Boston, MA (US)

(72) Inventors: Michael Gould, Boston, MA (US); Carl Ramey, Westborough, MA (US); Nicholas C. Harris, Boston, MA (US); Darius Bunandar, Boston, MA (US)

(73) Assignee: Lightmatter, Inc., Boston, MA (US)

( * ) Notice: Subject to any disclaimer, the term of this patent is extended or adjusted under 35 U.S.C. 154(b) by 576 days.

(21) Appl. No.: 17/359,025

(22) Filed: Jun. 25, 2021

(65) Prior Publication Data

US 2021/0405682 A1 Dec. 30, 2021

Related U.S. Application Data

(60) Provisional application No. 63/045,772, filed on Jun. 29, 2020.

(51) Int. Cl.
*G06E 3/00* (2006.01)
*H03H 17/00* (2006.01)
(Continued)

(52) U.S. Cl.
CPC ............ *G06E 3/008* (2013.01); *H03H 17/06* (2013.01); *H03H 2017/0081* (2013.01); *H03M 1/12* (2013.01)

(58) Field of Classification Search
CPC .... G06E 3/00–008; H03H 17/00–0036; H03H 17/02–0202; H03H 17/06;
(Continued)

(56) References Cited

U.S. PATENT DOCUMENTS 3,872,293 A 3/1975 Green
4,567,569 A 1/1986 Caulfield et al.
(Continued)

FOREIGN PATENT DOCUMENTS

CN 101630178 A 1/2010
WO WO 2005/029404 A2 3/2005
(Continued)

OTHER PUBLICATIONS

F.N. Hauske et al., Optical Performance Monitoring in Digital Coherent Receivers, Journal of Lightwave Technology, vol. 27, No. 16, 2009 (Year: 2009).*
(Continued)

*Primary Examiner* — Emily E Larocque
(74) *Attorney, Agent, or Firm* — Wolf, Greenfield & Sacks, P.C.

(57) ABSTRACT

Hybrid analog-digital processing systems are described. An example of a hybrid analog-digital processing system includes photonic accelerator configured to perform matrix-vector multiplication using light. The photonic accelerator exhibits a frequency response having a first bandwidth (e.g., less than 3 GHz). The hybrid analog-digital processing system further includes a plurality of analog-to-digital converters (ADCs) coupled to the photonic accelerator, and a plurality of digital equalizers coupled to the plurality of ADCs, wherein the digital equalizers are configured to set a frequency response of the hybrid analog-digital processing system to a second bandwidth greater than the first bandwidth.

21 Claims, 8 Drawing Sheets

(51) Int. Cl.
*H03H 17/06* (2006.01)
*H03M 1/12* (2006.01)

(58) Field of Classification Search
CPC .................... H03H 2017/0072–009; H03H 2017/0204–021; H03H 2017/0244; H03H 2017/0245; H03H 2218/10; H03H 2021/0092; H03H 2021/0094; H03H 2021/0096; H03M 1/12; H03M 1/66
See application file for complete search history.

(56) References Cited

U.S. PATENT DOCUMENTS

| | | | |
|---|---|---|---|
| 4,607,344 A | 8/1986 | Athale et al. | |
| 4,633,428 A | 12/1986 | Byron | |
| 4,686,646 A | 8/1987 | Goutzoulis | |
| 4,739,520 A | 4/1988 | Collins, Jr. et al. | |
| 4,809,204 A | 2/1989 | Dagenais et al. | |
| 4,849,940 A | 7/1989 | Marks, II et al. | |
| 4,877,297 A | 10/1989 | Yeh | |
| 4,948,212 A | 8/1990 | Cheng et al. | |
| 5,004,309 A | 4/1991 | Caulfield et al. | |
| 5,077,619 A | 12/1991 | Toms | |
| 5,095,459 A | 3/1992 | Ohta et al. | |
| 5,333,117 A | 7/1994 | Ha et al. | |
| 5,383,042 A | 1/1995 | Robinson | |
| 5,394,257 A | 2/1995 | Horan et al. | |
| 5,428,711 A | 6/1995 | Akiyama et al. | |
| 5,495,356 A | 2/1996 | Sharony et al. | |
| 5,576,873 A | 11/1996 | Crossland et al. | |
| 5,640,261 A | 6/1997 | Ono | |
| 5,699,449 A | 12/1997 | Javidi | |
| 5,784,309 A | 7/1998 | Budil | |
| 5,953,143 A | 9/1999 | Sharony et al. | |
| 6,005,998 A | 12/1999 | Lee | |
| 6,060,710 A | 5/2000 | Carrieri et al. | |
| 6,178,020 B1 | 1/2001 | Schultz et al. | |
| 6,728,434 B2 | 4/2004 | Flanders | |
| 7,136,587 B1 | 11/2006 | Davis et al. | |
| 7,173,272 B2 | 2/2007 | Ralph | |
| 7,536,431 B2* | 5/2009 | Goren | G06E 1/045 708/191 |
| 7,660,533 B1 | 2/2010 | Meyers et al. | |
| 7,876,248 B2 | 1/2011 | Berkley et al. | |
| 7,985,965 B2 | 7/2011 | Barker et al. | |
| 8,018,244 B2 | 9/2011 | Berkley | |
| 8,023,828 B2 | 9/2011 | Beausoleil et al. | |
| 8,026,837 B1 | 9/2011 | Valley et al. | |
| 8,027,587 B1 | 9/2011 | Watts | |
| 8,035,540 B2 | 10/2011 | Berkley et al. | |
| 8,129,670 B2 | 3/2012 | Laycock et al. | |
| 8,190,553 B2 | 5/2012 | Routt | |
| 8,223,414 B2 | 7/2012 | Goto | |
| 8,386,899 B2 | 2/2013 | Goto et al. | |
| 8,560,282 B2 | 10/2013 | Macready et al. | |
| 8,604,944 B2 | 12/2013 | Berkley et al. | |
| 8,620,855 B2 | 12/2013 | Bonderson | |
| 8,837,544 B2 | 9/2014 | Santori | |
| 9,009,560 B1 | 4/2015 | Matache et al. | |
| 9,250,391 B2 | 2/2016 | McLaughlin et al. | |
| 9,354,039 B2 | 5/2016 | Mower et al. | |
| 9,513,276 B2 | 12/2016 | Tearney et al. | |
| 9,791,258 B2 | 10/2017 | Mower | |
| 10,095,262 B2 | 10/2018 | Valley et al. | |
| 10,268,232 B2 | 4/2019 | Harris et al. | |
| 10,359,272 B2 | 7/2019 | Mower et al. | |
| 10,382,139 B2 | 8/2019 | Rosenhouse et al. | |
| 10,763,974 B2 | 9/2020 | Bunandar et al. | |
| 2003/0043133 A1 | 3/2003 | Tzelnick | |
| 2003/0086138 A1 | 5/2003 | Pittman et al. | |
| 2003/0235363 A1 | 12/2003 | Pfeiffer | |
| 2003/0235413 A1 | 12/2003 | Cohen et al. | |
| 2004/0243657 A1 | 12/2004 | Goren et al. | |
| 2005/0036786 A1 | 2/2005 | Ramachandran et al. | |
| 2006/0215949 A1 | 9/2006 | Lipson et al. | |
| 2007/0180586 A1 | 8/2007 | Amin | |
| 2008/0031566 A1 | 2/2008 | Matsubara et al. | |
| 2008/0212186 A1 | 9/2008 | Zoller et al. | |
| 2008/0212980 A1 | 9/2008 | Weiner | |
| 2008/0273835 A1 | 11/2008 | Popovic | |
| 2009/0028554 A1 | 1/2009 | Anderson et al. | |
| 2010/0165432 A1 | 7/2010 | Laycock et al. | |
| 2010/0215365 A1 | 8/2010 | Fukuchi | |
| 2013/0011093 A1 | 1/2013 | Goh et al. | |
| 2013/0024741 A1* | 1/2013 | Li | H04B 10/6971 714/755 |
| 2013/0121706 A1 | 5/2013 | Yang et al. | |
| 2014/0003761 A1 | 1/2014 | Dong | |
| 2014/0056585 A1 | 2/2014 | Qian et al. | |
| 2014/0241657 A1 | 8/2014 | Manouvrier | |
| 2014/0299743 A1 | 10/2014 | Miller | |
| 2015/0303934 A1 | 10/2015 | Chiu et al. | |
| 2015/0354938 A1 | 12/2015 | Mower et al. | |
| 2015/0382089 A1 | 12/2015 | Mazed | |
| 2016/0103281 A1 | 4/2016 | Matsumoto | |
| 2016/0112129 A1 | 4/2016 | Chang | |
| 2016/0118106 A1 | 4/2016 | Yoshimura et al. | |
| 2016/0162781 A1 | 6/2016 | Lillicrap et al. | |
| 2016/0162798 A1 | 6/2016 | Marandi et al. | |
| 2016/0182155 A1 | 6/2016 | Taylor et al. | |
| 2016/0245639 A1 | 8/2016 | Mower et al. | |
| 2016/0301478 A1 | 10/2016 | Luo et al. | |
| 2016/0352515 A1 | 12/2016 | Bunandar et al. | |
| 2017/0031101 A1 | 2/2017 | Miller | |
| 2017/0201813 A1 | 7/2017 | Sahni | |
| 2017/0237505 A1 | 8/2017 | Lucamarini et al. | |
| 2017/0285373 A1 | 10/2017 | Zhang et al. | |
| 2017/0351293 A1 | 12/2017 | Carolan et al. | |
| 2018/0107237 A1 | 4/2018 | Andregg et al. | |
| 2018/0274900 A1 | 9/2018 | Mower et al. | |
| 2018/0323825 A1 | 11/2018 | Cioffi et al. | |
| 2018/0335574 A1 | 11/2018 | Steinbrecher et al. | |
| 2019/0110084 A1 | 4/2019 | Jia et al. | |
| 2019/0346685 A1 | 11/2019 | Miller | |
| 2019/0354894 A1 | 11/2019 | Lazovich et al. | |
| 2019/0356394 A1 | 11/2019 | Bunandar et al. | |
| 2019/0370644 A1 | 12/2019 | Kenney et al. | |
| 2019/0370652 A1 | 12/2019 | Shen et al. | |
| 2019/0372589 A1 | 12/2019 | Gould et al. | |
| 2023/0152667 A1* | 5/2023 | Miscuglio | G06E 3/003 359/107 |

FOREIGN PATENT DOCUMENTS

| | | |
|---|---|---|
| WO | WO 2006/023067 A2 | 3/2006 |
| WO | WO 2008/069490 A1 | 6/2008 |
| WO | WO 2018/098230 A1 | 5/2018 |
| WO | WO 2019/217835 A1 | 11/2019 |

OTHER PUBLICATIONS

E.Ip et al., Digital Equalization of Chromatic Dispersion and Polarization Mode Disperson, Journal of Lightwave Technology, vol. 25, No. 8, 2007 (Year: 2007).*
International Search Report and Written Opinion mailed Nov. 17, 2021 in connection with International Application No. PCT/US2021/039227.
International Search Report and Written Opinion for International Application No. PCT/US19/32181 mailed Sep. 23, 2019.
International Search Report and Written Opinion for International Application No. PCT/US2019/032272 mailed Sep. 4, 2019.
International Search Report and Written Opinion from International Application No. PCT/US2015/034500, dated Mar. 15, 2016, 7 pages.
Invitation to Pay Additional Fees for International Application No. PCT/US19/32181 mailed Jul. 23, 2019.
Invitation to Pay Additional Fees for International Application No. PCT/US2019/032272 mailed Jun. 27, 2019.
Invitation to Pay Additional Fees mailed Aug. 24, 2021 in connection with International Application No. PCT/US2021/039227.
[No Author Listed], Optical Coherent Receiver Analysis. 2009 Optiwave Systems, Inc. 16 pages. URL:https://dru5cjyjifvrg.cloudfront.

(56) References Cited

OTHER PUBLICATIONS net/wp-content/uploads/2017/03/OptiSystem-Applications-Coherent-Receiver-Analysis.pdf [retrieved on Aug. 17, 2019].
Aaronson et al., Computational complexity of linear optics. Proceedings of the 43rd Annual ACM Symposium on Theory of Computing. 2011. 101 pages. ISBN 978-1-4503-0691-1.
Abu-Mostafa et al., Optical neural computers. Scientific American. 1987:88-95.
Albert et al., Statistical mechanics of com-plex networks. Reviews of Modern Physics. 2002;(74):47-97.
Almeida et al., All-optical control of light on a silicon chip. Nature. 2004;431:1081-1084.
Amir et al., Classical diffusion of a quantum particle in a noisy environment. Physical Review E. 2009;79. 5 pages. DOI: 10.1103/PhysRevE.79.050105.
Amit et al., Spin-glass models of neural networks. Physical Review A. 1985;32(2):1007-1018.
Anitha et al., Comparative Study of High performance Braun's multiplier using FPGAs. IOSR Journal of Electronics and Communication Engineering (IOSRJECE). 2012;1:33-37.
Appeltant et al., Information processing using a single dynamical node as complex system. Nature Communications. 2011. 6 pages. DOI: 10.1038/ncomms1476.
Arjovsky et al., Unitary Evolution Recurrent Neural Networks. arXiv:1511.06464. 2016. 9 pages.
Aspuru-Guzik et al., Photonic quantum simulators. Nature Physics. 2012;8:285-291. DOI: 10.1038/NPHYS2253.
Aspuru-Guzik et al., Simulated Quantum Computation of Molecular Energies. Science. 2005;309:1704-7.
Atabaki et al., Integrating photonics with silicon nanoelectronics for the next generation of systems on a chip. Nature. 2018;556(7701):349-354. 10 pages. DOI: 10.1038/s41586-018-0028-z.
Baehr-Jones et al., A 25 GB/s Silicon Photonics Platform. arXiv:1203.0767. 2012. 11 pages.
Bao et al., Atomic-Layer Graphene as a Saturable Absorber for Ultrafast Pulsed Lasers. 24 pages. 2009.
Bao et al., Monolayer graphene as a saturable absorber in a mode-locked laser. Nano Research. 2011;4:297-307. DOI: 10.1007/s12274-010-0082-9.
Barahona, On the computational complexity of Ising spin glass models. Journal of Physics A: Mathematical and General. 1982;15:3241-3253.
Bertsimas et al., Robust optimization with simulated annealing. Journal of Global Optimization. 2010;48:323-334. DOI 10.1007/s10898-009-9496-x.
Bewick, Fast multiplication: algorithms and implementation. Ph.D. thesis, Stanford University (1994). 170 pages.
Bonneau et al., Quantum interference and manipulation of entanglement in silicon wire waveguide quantum circuits. New Journal of Physics. 2012;14:045003. 13 pages. DOI: 10.1088/1367-2630/14/4/045003.
Brilliantov, Effective magnetic Hamiltonian and Ginzburg criterion for fluids. Physical Review E. 1998;58:2628-2631.
Bromberg et al., Bloch oscillations of path-entangled photons. Physical Review Letters. 2010;105:263604-1-2633604-4. 4 pages. DOI: 10.1103/PhysRevLett.105.263604.
Bromberg et al., Quantum and Classical Correlations in Waveguide Lattices. Physical Review Letters. 2009;102:253904-1-253904-4. 4 pages. DOI: 10.1103/PhysRevLett.102.253904.
Broome et al., Photonic Boson Sampling in a Tunable Circuit. Science. 2012;339:794-8.
Bruck et al., On the power of neural networks for solving hard problems. American Institute of Physics. 1988. pp. 137-143. 7 pages.
Canziani et al., Evaluation of neural network architectures for embedded systems. Circuits and Systems (ISCAS). 2017 IEEE International Symposium. 4 pages.
Cardenas et al., Low loss etchless silicon photonic waveguides. Optics Express. 2009;17(6):4752-4757.
Carolan et al., Universal linear optics. Science. 2015;349:711-716.
Caves, Quantum-mechanical noise in an interferometer. Physical Review D. 1981;23(8):1693-1708. 16 pages.
Centeno et al., Optical bistability in finite-size nonlinear bidimensional photonic crystals doped by a microcavity. Physical Review B. 2000;62(12):R7683-R7686.
Chan, Optical flow switching networks. Proceedings of the IEEE. 2012;100(5):1079-1091.
Chen et al., Compact, low-loss and low-power 8×8 broadband silicon optical switch. Optics Express. 2012;20(17):18977-18985.
Chen et al., DianNao: A small-footprint high-throughput accelerator for ubiquitous machine-learning. ACM Sigplan Notices. 2014;49:269-283.
Chen et al., Efficient photon pair sources based on silicon-on-insulator microresonators. Proc. of SPIE. 2010;7815. 10 pages.
Chen et al., Frequency-bin entangled comb of photon pairs from a Silicon-on-Insulator micro-resonator. Optics Express. 2011;19(2):1470-1483.
Chen et al., Universal method for constructing N-port nonblocking optical router based on 2×2 optical switch for photonic networks-on-chip. Optics Express. 2014;22(10);12614-12627. DOI: 10.1364/OE.22.012614.
Cheng et al., In-Plane Optical Absorption and Free Carrier Absorption in Graphene-on-Silicon Waveguides. IEEE Journal of Selected Topics in Quantum Electronics. 2014;20(1). 6 pages.
Chetlur et al., cuDNN: Efficient primitives for deep learning. arXiv preprint arXiv:1410.0759. 2014. 9 pages.
Childs et al., Spatial search by quantum walk. Physical Review A. 2004;70(2):022314. 11 pages.
Chung et al., A monolithically integrated large-scale optical phased array in silicon-on-insulator cmos. IEEE Journal of Solid-State Circuits. 2018;53:275-296.
Cincotti, Prospects on planar quantum computing. Journal of Lightwave Technology. 2009;27(24):5755-5766.
Clements et al., Optimal design for universal multiport interferometers. Optica. 2016;3(12):1460-1465.
Crespi et al., Integrated multimode interferometers with arbitrary designs for photonic boson sampling. Nature Photonics. 2013;7:545-549. DOI: 10.1038/NPHOTON.2013.112.
Crespi, et al., Anderson localization of entangled photons in an integrated quantum walk. Nature Photonics. 2013;7:322-328. DOI: 10.1038/NPHOTON.2013.26.
Dai et al., Novel concept for ultracompact polarization splitter-rotator based on silicon nanowires. Optics Express. 2011;19(11):10940-9.
Di Giuseppe et al., Einstein-Podolsky-Rosen Spatial Entanglement in Ordered and Anderson Photonic Lattices. Physical Review Letters. 2013;110:150503-1-150503-5. DOI: 10.1103/PhysRevLett.110.150503.
Dunningham et al., Efficient comparison of path-lengths using Fourier multiport devices. Journal of Physics B: Atomic, Molecular and Optical Physics. 2006;39:1579-1586. DOI:10.1088/0953-4075/39/7/002.
Esser et al., Convolutional networks for fast, energy-efficient neuromorphic computing. Proceedings of the National Academy of Sciences. 2016;113(41):11441-11446.
Farhat et al., Optical implementation of the Hopfield model. Applied Optics. 1985;24(10):1469-1475.
Feinberg et al., Making memristive neural network accelerators reliable. IEEE International Symposium on High Performance Computer Architecture (HPCA). 2018. pp. 52-65. DOI 10.1109/HPCA.2018.00015.
Fushman et al., Controlled Phase Shifts with a Single Quantum Dot. Science. 2008;320:769-772. DOI: 10.1126/science.1154643.
George et al., A programmable and configurable mixed-mode FPAA SoC. IEEE Transactions on Very Large Scale Integration (VLSI) Systems. 2016;24:2253-2261.
Gilmer et al., Neural message passing for quantum chemistry. arXiv preprint arXiv:1704.01212. Jun. 2017. 14 pages.
Golub et al., Calculating the singular values and pseudo-inverse of a matrix. Journal of the Society for Industrial and Applied Mathematics Series B Numerical Analysis. 1965;2(2):205-224.

(56) References Cited

OTHER PUBLICATIONS

Graves et al., Hybrid computing using a neural network with dynamic external memory. Nature. 2016;538. 21 pages. DOI:10.1038/nature20101.

Grote et al., First long-term application of squeezed states of light in a gravitational-wave observatory. Physical Review Letter. 2013;110:181101. 5 pages. DOI: 10.1103/PhysRevLett.110.181101.

Gruber et al., Planar-integrated optical vector-matrix multiplier. Applied Optics. 2000;39(29):5367-5373.

Gullans et al., Single-Photon Nonlinear Optics with Graphene Plasmons. Physical Review Letter. 2013;111:247401-1-247401-5. DOI: 10.1103/PhysRevLett.111.247401.

Gunn, CMOS photonics for high-speed interconnects. IEEE Micro. 2006;26:58-66.

Haffner et al., Low-loss plasmon-assisted electro-optic modulator. Nature. 2018;556:483-486. 17 pages. DOI: 10.1038/s41586-018-0031-4.

Halasz et al., Phase diagram of QCD. Physical Review D. 1998;58:096007. 11 pages.

Hamerly et al., Scaling advantages of all-to-all connectivity in physical annealers: the Coherent Ising Machine vs. D-Wave 2000Q. arXiv preprints, May 2018. 17 pages.

Harris et al. Efficient, Compact and Low Loss Thermo-Optic Phase Shifter in Silicon. Optics Express. 2014;22(9);10487-93. DOI:10.1364/OE.22.010487.

Harris et al., Bosonic transport simulations in a large-scale programmable nanophotonic processor. arXiv:1507.03406. 2015. 8 pages.

Harris et al., Integrated source of spectrally filtered correlated photons for large-scale quantum photonic systems. Physical Review X. 2014;4:041047. 10 pages. DOI: 10.1103/PhysRevX.4.041047.

Harris et al., Quantum transport simulations in a programmable nanophotonic processor. Nature Photonics. 2017;11:447-452. DOI: 10.1038/NPHOTON.2017.95.

Hinton et al., Reducing the dimensionality of data with neural networks. Science. 2006;313:504-507.

Hochberg et al., Silicon Photonics: The Next Fabless Semiconductor Industry. IEEE Solid-State Circuits Magazine. 2013. pp. 48-58. DOI: 10.1109/MSSC.2012.2232791.

Honerkamp-Smith et al., An introduction to critical points for biophysicists; observations of compositional heterogeneity in lipid membranes. Biochimica et Biophysica Acta (BBA). 2009;1788:53-63. DOI: 10.1016/j.bbamem.2008.09.010.

Hong et al., Measurement of subpicosecond time intervals between two photons by interference. Physical Review Letters. 1987;59(18):2044-2046.

Hopfield et al., Neural computation of decisions in optimization problems. Biological Cybernetics. 1985;52;141-152.

Hopfield, Neural networks and physical systems with emergent collective computational abilities. PNAS. 1982;79:2554-2558. DOI: 10.1073/pnas.79.8.2554.

Horowitz, Computing's energy problem (and what we can do about it). Solid-State Circuits Conference Digest of Technical Papers (ISSCC), 2014 IEEE International. 5 pages.

Horst et al., Cascaded Mach-Zehnder wavelength filters in silicon photonics for low loss and flat pass-band WDM (de-)multiplexing. Optics Express. 2013;21(10):11652-8. DOI:10.1364/OE.21.011652.

Humphreys et al., Linear Optical Quantum Computing in a Single Spatial Mode. Physical Review Letters. 2013;111:150501. 5 pages. DOI: 10.1103/PhysRevLett.111.150501.

Inagaki et al., Large-scale ising spin network based on degenerate optical parametric oscillators. Nature Photonics. 2016;10:415-419. 6 pages. DOI: 10.1038/NPHOTON.2016.68.

Isichenko, Percolation, statistical topography, and trans-port in random media. Reviews of Modern Physics. 1992;64(4):961-1043.

Jaekel et al., Quantum limits in interferometric measurements. Europhysics Letters. 1990;13(4):301-306.

Jalali et al., Silicon Photonics. Journal of Lightwave Technology. 2006;24(12):4600-15. DOI: 10.1109/JLT.2006.885782.

Jia et al., Caffe: Convolutional architecture for fast feature embedding. Proceedings of the 22nd ACM International Conference on Multimedia. Nov. 2014. 4 pages. URL:http://doi.acm.org/10.1145/2647868.2654889.

Jiang et al., A planar ion trapping microdevice with integrated waveguides for optical detection. Optics Express. 2011;19(4):3037-43.

Jonsson, An empirical approach to finding energy efficient ADC architectures. 2011 International Workshop on ADC Modelling, Testing and Data Converter Analysis and Design and IEEE 2011 ADC Forum. 6 pages.

Jouppi et al., In-datacenter performance analysis of a tensor processing unit. Proceeding of Computer Architecture (ISCA). Jun. 2017. 12 pages. URL:https://doi.org/10.1145/3079856.3080246.

Kahn et al., Communications expands its space. Nature Photonics. 2017;11:5-8.

Kardar et al., Dynamic Scaling of Growing Interfaces. Physical Review Letters. 1986;56(9):889-892.

Karpathy, CS231n Convolutional Neural Networks for Visual Recognition. Class notes. 2019. URL:http://cs231n.github.io/ 2 pages. [last accessed Sep. 24, 2019].

Kartalopoulos, Part III Coding Optical Information. Introduction to DWDM Technology. IEEE Press. 2000. pp. 165-166.

Keckler et al., GPUs and the future of parallel computing. IEEE Micro. 2011;31:7-17. DOI: 10.1109/MM.2011.89.

Kieling et al., On photonic Controlled Phase Gates. New Journal of Physics. 2010; 12:0133003. 17 pages. DOI: 10.1088/1367-2630/12/1/013003.

Kilper et al., Optical networks come of age. Optics Photonics News. 2014;25:50-57. DOI: 10.1364/OPN.25.9.000050.

Kim et al., A functional hybrid memristor crossbar-array/cmos system for data storage and neuromorphic applications. Nano Letters. 2011;12:389-395.

Kirkpatrick et al., Optimization by simulated annealing. Science. 1983;220(4598):671-680.

Knill et al., A scheme for efficient quantum computation with linear optics. Nature. 2001;409(4652):46-52.

Knill et al., The Bayesian brain: the role of uncertainty in neural coding and computation. Trends in Neurosciences. 2004;27(12):712-719.

Knill, Quantum computing with realistically noisy devices. Nature. 2005;434:39-44.

Kok et al., Linear optical quantum computing with photonic qubits. Reviews of Modern Physics. 2007;79(1):135-174.

Koos et al., Silicon-organic hybrid (SOH) and plasmonic-organic hybrid (POH) integration. Journal of Lightwave Technology. 2016;34(2):256-268.

Krizhevsky et al., ImageNet classification with deep convolutional neural networks. Advances in Neural Information Processing Systems (NIPS). 2012. 9 pages.

Kucherenko et al., Application of Deterministic Low-Discrepancy Sequences in Global Optimization. Computational Optimization and Applications. 2005;30:297-318.

Kwack et al., Monolithic InP strictly non-blocking 8×8 switch for high-speed WDM optical interconnection. Optics Express. 2012;20(27):28734-41.

Lahini et al., Anderson Localization and Nonlinearity in One-Dimensional Disordered Photonic Lattices. Physical Review Letters. 2008;100:013906. 4 pages. DOI: 10.1103/PhysRevLett.100.013906.

Lahini et al., Quantum Correlations in Two-Particle Anderson Localization. Physical Review Letters. 2010;105:163905. 4 pages. DOI: 10.1103/PhysRevLett.105.163905.

Laing et al., High-fidelity operation of quantum photonic circuits. Applied Physics Letters. 2010;97:211109. 5 pages. DOI: 10.1063/1.3497087.

Landauer, Irreversibility and heat generation in the computing process. IBM Journal of Research and Development. 1961. pp. 183-191.

Lanyon et al., Towards quantum chemistry on a quantum computer. Nature Chemistry. 2010;2:106-10. Doi: 10.1038/NCHEM.483.

(56) References Cited

OTHER PUBLICATIONS

Lawson et al., Basic linear algebra subprograms for Fortran usage. ACM Transactions on Mathematical Software (TOMS). 1979;5(3):308-323.

Lecun et al., Deep learning. Nature. 2015;521:436-444. DOI:10.1038/nature14539.

Lecun et al., Gradient-based learning applied to document recognition. Proceedings of the IEEE. Nov. 1998. 46 pages.

Levi et al., Hyper-transport of light and stochastic acceleration by evolving disorder. Nature Physics. 2012;8:912-7. DOI: 10.1038/NPHYS2463.

Li et al., Efficient and self-adaptive in-situ learning in multilayer memristor neural networks. Nature Communications. 2018;9:2385. 8 pages. doi: 10.1038/s41467-018-04484-2.

Lin et al., All-optical machine learning using diffractive deep neural networks. Science. 2018;361:1004-1008. 6 pages. doi: 10.1126/science.aat8084.

Little, The existence of persistent states in the brain. Mathematical Biosciences. 1974;19:101-120.

Liu et al., Towards 1-Tb/s Per-Channel Optical Transmission Based on Multi-Carrier Modulation. 19th Annual Wireless and Optical Communications Conference. May 2010. 4 pages. DOI: 10.1109/WOCC.2010.5510630.

Lu et al., 16×16 non-blocking silicon optical switch based on electro-optic Mach-Zehnder interferometers. Optics Express. 2016:24(9):9295-9307. doi: 10.1364/OE.24.009295.

Ma et al., Optical switching technology comparison: Optical mems vs. Other technologies. IEEE Optical Communications. 2003;41(11):S16-S23.

Macready et al., Criticality and Parallelism in Combinatorial Optimization. Science. 1996;271:56-59.

Marandi et al., Network of time-multiplexed optical parametric oscillators as a coherent Ising machine. Nature Photonics. 2014;8:937-942. doi: 10.1038/NPHOTON.2014.249.

Martin-Lopez et al., Experimental realization of Shor's quantum factoring algorithm using qubit recycling. Nature Photonics. 2012;6:773-6. DOI: 10.1038/NPHOTON.2012.259.

McMahon et al., A fully programmable 100-spin coherent Ising machine with all-to-all connections. Science. 2016;354(6312):614-7. DOI: 10.1126/science.aah5178.

Mead, Neuromorphic electronic systems. Proceedings of the IEEE. 1990;78(10):1629-1636.

Migdall et al., Tailoring single-photon and multiphoton probabilities of a single-photon on-demand source. Physical Review A. 2002;66:053805. 4 pages. DOI: 10.1103/PhysRevA.66.053805.

Mikkelsen et al., Dimensional variation tolerant silicon-on-insulator directional couplers. Optics Express. 2014;22(3):3145-50. DOI:10.1364/OE.22.003145.

Miller, Are optical transistors the logical next step? Nature Photonics. 2010;4:3-5.

Miller, Attojoule optoelectronics for low-energy information processing and communications. Journal of Lightwave Technology. 2017;35(3):346-96. DOI: 10.1109/JLT.2017.2647779.

Miller, Energy consumption in optical modulators for interconnects. Optics Express. 2012;20(S2):A293-A308.

Miller, Perfect optics with imperfect components. Optica. 2015;2(8):747-750.

Miller, Reconfigurable add-drop multiplexer for spatial modes. Optics Express. 2013;21(17):20220-9. DOI:10.1364/OE.21.020220.

Miller, Self-aligning universal beam coupler, Optics Express. 2013;21(5):6360-70.

Miller, Self-configuring universal linear optical component [Invited]. Photonics Research. 2013;1(1):1-15. URL:http://dx.doi.org/10.1364/PRJ.1.000001.

Misra et al., Artificial neural networks in hardware: A survey of two decades of progress. Neurocomputing. 2010;74:239-255.

Mohseni et al., Environment-assisted quantum walks in photosynthetic complexes. The Journal of Chemical Physics. 2008;129:174106. 10 pages. DOI: 10.1063/1.3002335.

Moore, Cramming more components onto integrated circuits. Proceeding of the IEEE. 1998;86(1):82-5.

Mower et al., Efficient generation of single and entangled photons on a silicon photonic integrated chip. Physical Review A. 2011;84:052326. 7 pages. DOI: 10.1103/PhysRevA.84.052326.

Mower et al., High-fidelity quantum state evolution in imperfect photonic integrated circuits. Physical Review A. 2015;92(3):032322. 7 pages. doi: 10.1103/PhysRevA.92.032322.

Nagamatsu et al., A 15 NS 32×32-bit CMOS multiplier with an improved parallel structure. IEEE Custom Integrated Circuits Conference. 1989. 4 pages.

Najafi et al., On-Chip Detection of Entangled Photons by Scalable Integration of Single-Photon Detectors. arXiv:1405.4244. May 16, 2014. 27 pages.

Najafi et al., On-Chip detection of non-classical light by scalable integration of single-photon detectors. Nature Communications. 2015;6:5873. 8 pages. DOI: 10.1038/ncomms6873.

Naruse, Nanophotonic Information Physics. Nanointelligence and Nanophotonic Computing. Springer. 2014. 261 pages. DOI 10.1007/978-3-642-40224-1.

Nozaki et al., Sub-femtojoule all-optical switching using a photonic-crystal nanocavity. Nature Photonics. 2010;4:477-483. doi: 10.1038/NPHOTON.2010.89.

O'Brien et al., Demonstration of an all-optical quantum controlled-NOT gate. Nature. 2003;426:264-7.

Onsager, Crystal Statistics. I. A Two-Dimensional Model with an Order-Disorder Transition. Physical Review. 1944;65(3,4):117-149.

Orcutt et al., Nanophotonic integration in state-of-the-art CMOS foundries. Optics Express. 2011;19(3):2335-46.

Pelissetto et al., Critical phenomena and renormalization-group theory. Physics Reports. Apr. 2002. 150 pages.

Peng, Implementation of AlexNet with Tensorflow. https://github.com/ykpengba/AlexNet-A-Practical-Implementation. 2018. 2 pages. [last accessed Sep. 24, 2019].

Peretto, Collective properties of neural networks: A statistical physics approach. Biological Cybernetics. 1984;50:51-62.

Pernice et al., High-speed and high-efficiency travelling wave single-photon detectors embedded in nanophotonic circuits. Nature Communications 2012;3:1325. 10 pages. DOI: 10.1038/ncomms2307.

Peruzzo et al., Quantum walk of correlated photons. Science. 2010;329;1500-3. DOI: 10.1126/science.1193515.

Politi et al., Integrated Quantum Photonics, IEEE Journal of Selected Topics in Quantum Electronics, 2009;5(6):1-12. DOI: 10.1109/JSTQE.2009.2026060.

Politi et al., Silica-on-Silicon Waveguide Quantum Circuits. Science. 2008;320:646-9. DOI: 10.1126/science.1155441.

Poon et al., Neuromorphic silicon neurons and large-scale neural networks: challenges and opportunities. Frontiers in Neuroscience. 2011;5:1-3. doi: 10.3389/fnins.2011.00108.

Prucnal et al., Recent progress in semiconductor excitable lasers for photonic spike processing. Advances in Optics and Photonics. 2016;8(2):228-299.

Psaltis et al., Holography in artificial neural networks. Nature. 1990;343:325-330.

Qiao et al., 16×16 non-blocking silicon electro-optic switch based on mach zehnder interferometers. Optical Fiber Communication Conference. Optical Society of America. 2016. 3 pages.

Ralph et al., Linear optical controlled-NOT gate in the coincidence basis. Physical Review A. 2002;65:062324-1-062324-5. DOI: 10.1103/PhysRevA.65.062324.

Ramanitra et al., Scalable and multi-service passive optical access infrastructure using variable optical splitters. Optical Fiber Communication Conference. Optical Society of America. 2005. 3 pages.

Raussendorf et al., A one-way quantum computer. Physical Review Letter. 2001;86(22):5188-91. DOI: 10.1103/PhysRevLett.86.5188.

Rechtsman et al., Photonic floquet topological insulators. Nature. 2013;496:196-200. doi: 10.1038/nature12066.

Reck et al., Experimental realization of any discrete unitary operator. Physical review letters. 1994;73(1):58-61. 6 pages.

Reed et al., Silicon optical modulators. Nature Photonics. 2010;4:518-26. DOI: 10.1038/NPHOTON.2010.179.

(56) References Cited

OTHER PUBLICATIONS

Rendl et al., Solving Max-Cut to optimality by intersecting semidefinite and polyhedral relaxations. Mathematical Programming. 2010;121:307-335. doi: 10.1007/s10107-008-0235-8.
Rios et al., Integrated all-photonic non-volatile multilevel memory. Nature Photonics. 2015;9:725-732. doi: 10.1038/NPHOTON.2015.182.
Rogalski, Progress in focal plane array technologies. Progress in Quantum Electronics. 2012;36:342-473.
Rohit et al., 8×8 space and wavelength selective cross-connect for simultaneous dynamic multi-wavelength routing. Optical Fiber Communication Conference. OFC/NFOEC Technical Digest. 2013. 3 pages.
Rosenblatt, The perceptron: a probabilistic model for information storage and organization in the brain. Psychological Review. 1958;65(6):386-408.
Russakovsky et al., ImageNet Large Scale Visual Recognition Challenge. arXiv:1409.0575v3. Jan. 2015. 43 pages.
Saade et al., Random projections through multiple optical scattering: Approximating Kernels at the speed of light. arXiv:1510.06664v2. Oct. 25, 2015. 6 pages.
Salandrino et al., Analysis of a three-core adiabatic directional coupler. Optics Communications. 2009;282:4524-6. doi:10.1016/j.optcom.2009.08.025.
Schaeff et al., Scalable fiber integrated source for higher-dimensional path-entangled photonic quNits. Optics Express. 2012;20(15):16145-153.
Schirmer et al., Nonlinear mirror based on two-photon absorption. Journal of the Optical Society of America B. 1997;14(11):2865-8.
Schmidhuber, Deep learning in neural networks: An overview. Neural Networks. 2015;61:85-117.
Schreiber et al., Decoherence and Disorder in Quantum Walks: From Ballistic Spread to Localization. Physical Review Letters. 2011;106:180403. 4 pages. DOI: 10.1103/PhysRevLett.106.180403.
Schwartz et al., Transport and Anderson localization in disordered two-dimensional photonic lattices. Nature. 2007;446:52-5. doi:10.1038/nature05623.
Selden, Pulse transmission through a saturable absorber. British Journal of Applied Physics. 1967;18:743-8.
Shafiee et al., Isaac: A convolutional neural network accelerator with in-situ analog arithmetic in crossbars. ACM/IEEE 43rd Annual International Symposium on Computer Architecture. Oct. 2016. 13 pages.
Shen et al., Deep learning with coherent nanophotonic circuits. Nature Photonics. 2017;11:441-6. DOI: 10.1038/NPHOTON.2017.93.
Shoji et al., Low-crosstalk 2×2 thermo-optic switch with silicon wire waveguides. Optics Express.2010; 18(9):9071-5.
Silver et al. Mastering chess and shogi by self-play with a general reinforcement learning algorithm. arXiv preprint arXiv:1712.01815. 19 pages. 2017.
Silver et al., Mastering the game of go with deep neural networks and tree search. Nature. 2016;529:484-9. 20 pages. doi:10.1038/nature16961.
Silver et al., Mastering the game of Go without human knowledge. Nature. 2017;550:354-9. 18 pages. doi:10.1038/nature24270.
Silverstone et al., On-chip quantum interference between silicon photon-pair sources. Nature Photonics. 2014;8:104-8. DOI: 10.1038/NPHOTON.2013.339.
Smith et al., Phase-controlled integrated photonic quantum circuits. Optics Express. 2009;17(16):13516-25.
Soljacic et al., Optimal bistable switching in nonlinear photonic crystals. Physical Review E. 2002;66:055601. 4 pages.
Solli et al., Analog optical computing. Nature Photonics. 2015;9:704-6.
Spring et al., Boson sampling on a photonic chip. Science. 2013;339:798-801. DOI: 10.1126/science.1231692.
Srinivasan et al., 56 GB/s germanium waveguide electro-absorption modulator. Journal of Lightwave Technology. 2016;34(2):419-24. DOI: 10.1109/JLT.2015.2478601.
Steinkraus et al., Using GPUs for machine learning algorithms. Proceedings of the 2005 Eight International Conference on Document Analysis and Recognition. 2005. 6 pages.
Suda et al., Quantum interference of photons in simple networks. Quantum Information Process. 2013;12:1915-45. DOI 10.1007/s11128-012-0479-3.
Sun et al., Large-scale nanophotonic phased array. Nature. 2013;493:195-9. doi:10.1038/nature11727.
Sun et al., Single-chip microprocessor that communicates directly using light. Nature. 2015;528:534-8. doi:10.1038/nature16454.
Suzuki et al., Ultra-compact 8×8 strictly-non-blocking Si-wire PILOSS switch. Optics Express. 2014;22(4):3887-94. DOI:10.1364/OE.22.003887.
Sze et al., Efficient processing of deep neural networks: A tutorial and survey. Proceedings of the IEEE. 2017;105(12):2295-2329. DOI: 10.1109/JPROC.2017.276174.
Tabia, Experimental scheme for qubit and qutrit symmetric informationally complete positive operator-valued measurements using multiport devices. Physical Review A. 2012;86:062107. 8 pages. DOI: 10.1103/PhysRevA.86.062107.
Tait et al., Broadcast and weight: An integrated network for scalable photonic spike processing. Journal of Lightwave Technology. 2014;32(21):3427-39. DOI: 10.1109/JLT.2014.2345652.
Tait et al., Chapter 8 Photonic Neuromorphic Signal Processing and Computing. Springer, Berlin, Heidelberg. 2014. pp. 183-222.
Tait et al., Neuromorphic photonic networks using silicon photonic weight banks. Scientific Reports. 2017;7:7430. 10 pages.
Tanabe et al., Fast bistable all-optical switch and memory on a silicon photonic crystal on-chip. Optics Letters. 2005;30(19):2575-7.
Tanizawa et al., Ultra-compact 32×32 strictly-non-blocking Si-wire optical switch with fan-out LGA interposer. Optics Express. 2015;23(13):17599-606. DOI:10.1364/OE.23.017599.
Thompson et al., Integrated waveguide circuits for optical quantum computing. IET Circuits, Devices, & Systems. 2011;5(2):94-102. doi: 10.1049/iet-cds.2010.0108.
Timurdogan et al., An ultralow power athermal silicon modulator. Nature Communications. 2014;5:4008. 11 pages. DOI: 10.1038/ncomms5008.
Vandoorne et al., Experimental demonstration of reservoir computing on a silicon photonics chip. Nature Communications. 2014;5:3541. 6 pages. DOI: 10.1038/ncomms4541.
Vazquez et al., Optical NP problem solver on laser-written waveguide plat-form. Optics Express. 2018;26(2):702-10.
Vivien et al., Zero-bias 40gbit/s germanium waveguide photodetector on silicon. Optics Express. 2012;20(2):1096-1101.
Wang et al., Coherent Ising machine based on degenerate optical parametric oscillators. Physical Review A. 2013;88:063853. 9 pages. DOI: 10.1103/PhysRevA.88.063853.
Wang et al., Deep learning for identifying metastatic breast cancer. arXiv preprint arXiv: 1606.05718. Jun. 18, 2016. 6 pages.
Werbos, Beyond regression: New tools for prediction and analysis in the behavioral sciences. Ph.D. dissertation, Harvard University. Aug. 1974. 454 pages.
Whitfield et al., Simulation of electronic structure Hamiltonians using quantum computers. Molecular Physics. 2010;109(5,10):735-50. DOI: 10.1080/00268976.2011.552441.
Wu et al., An optical fiber network oracle for NP-complete problems. Light: Science & Applications. 2014;3: e147. 5 pages. doi: 10.1038/lsa.2014.28.
Xia et al., Mode conversion losses in silicon-on-insulator photonic wire based racetrack resonators. Optics Express. 2006;14(9):3872-86.
Xu et al., Experimental observations of bistability and instability in a two-dimensional nonlinear optical superlattice. Physical Review Letters. 1993;71(24):3959-62.
Yang et al., Non-Blocking 4×4 Electro-Optic Silicon Switch for On-Chip Photonic Networks. Optics Express 2011;19(1):47-54.
Yao et al., Serial-parallel multipliers. Proceedings of 27th Asilomar Conference on Signals, Systems and Computers. 1993. pp. 359-363.

(56) References Cited

OTHER PUBLICATIONS

Young et al., Recent trends in deep learning based natural language processing. IEEE Computational Intelligence Magazine. arXiv:1708.02709v8. Nov. 2018. 32 pages.

Zhou et al., Calculating Unknown Eigenvalues with a Quantum Algorithm. Nature Photonics. 2013;7:223-8. DOI: 10.1038/NPHOTON.2012.360.

\* cited by examiner

FAST PREDICTION PROCESSOR

CROSS-REFERENCE TO RELATED APPLICATION

This application claims the benefit under 35 U.S.C. § 119(e) of U.S. Provisional Patent Application Ser. No. 63/045,772, entitled "FAST PREDICTION PROCESSOR," filed on Jun. 29, 2020, which is hereby incorporated herein by reference in its entirety.

BACKGROUND

Deep learning, machine learning, latent-variable models, neural networks, and other matrix-based differentiable programs are used to solve a variety of problems, including natural language processing and object recognition in images. Solving these problems with deep neural networks typically requires long processing times to perform the required computation. The most computationally intensive operations in solving these problems are often mathematical matrix operations, such as matrix multiplication.

SUMMARY OF THE DISCLOSURE

In an embodiment, a hybrid analog-digital processing system includes:

a photonic accelerator configured to perform matrix-vector multiplication using light, wherein the photonic accelerator exhibits a frequency response having a first bandwidth;

a plurality of analog-to-digital converters (ADCs) coupled to the photonic accelerator; and a plurality of digital equalizers coupled to the plurality of ADCs, wherein the digital equalizers are configured to set a frequency response of the hybrid analog-digital processing system to a second bandwidth greater than the first bandwidth.

In an embodiment, a method for performing a mathematical operation using a hybrid analog-digital processing system comprising a photonic accelerator, includes:

obtaining a plurality of parameters representing a first matrix;

obtaining a first plurality of inputs representing a first input vector and obtaining a second plurality of inputs representing a second input vector;

at a first time, generating a first output vector by performing matrix-vector multiplication using the photonic accelerator based at least in part on the plurality of parameters and the first plurality of inputs;

at a second time subsequent to the first time, generating a second output vector by performing matrix-vector multiplication using the photonic accelerator based at least in part on the second plurality of inputs; and generating an equalized output vector by combining the first output vector with the second output vector.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in the figures in which they appear.

DETAILED DESCRIPTION

I. Overview

Figure 1A:
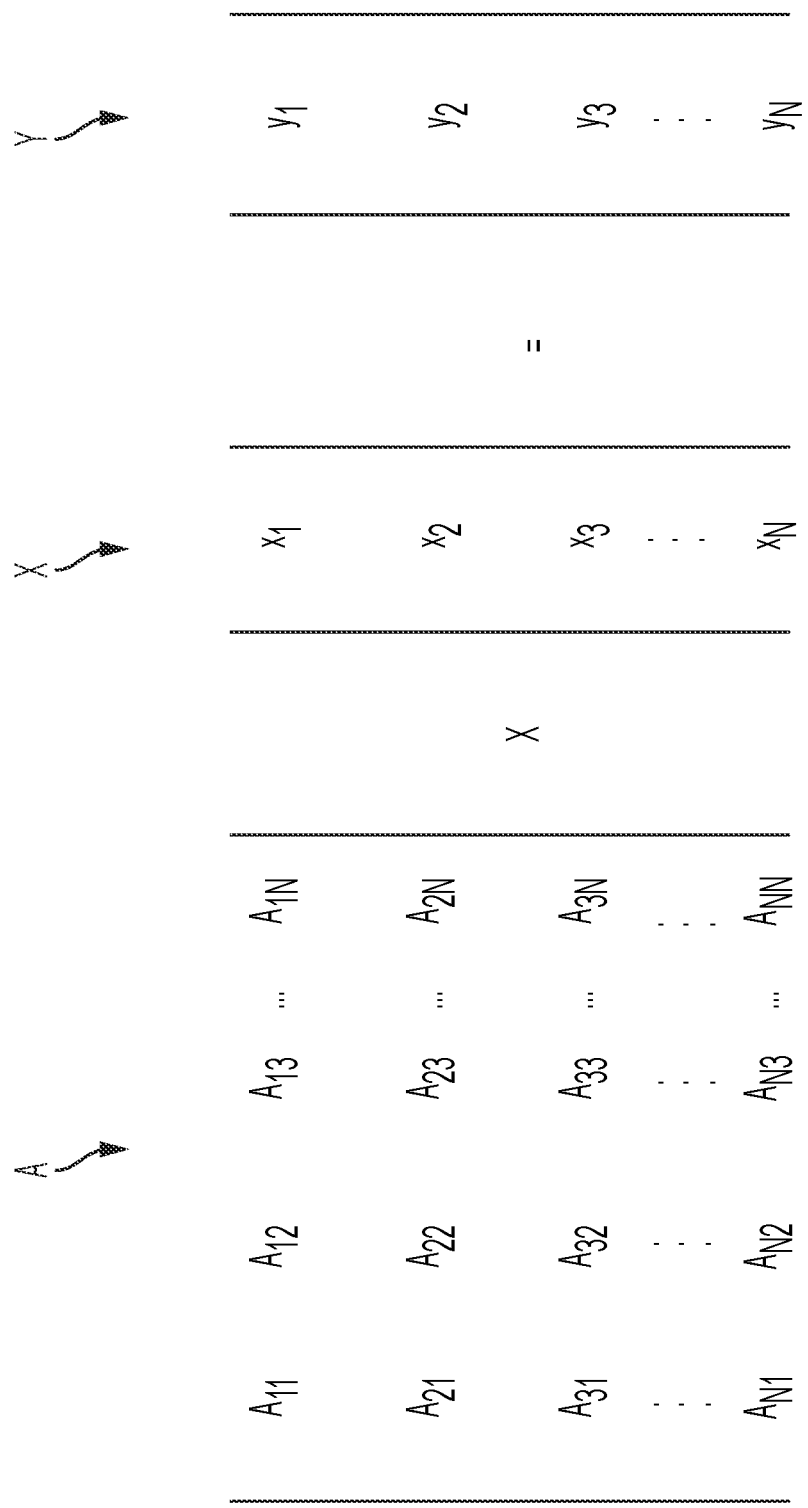
FIG. 1A illustrates a representative matrix-vector multiplication, in accordance with some embodiments.

The inventors have recognized and appreciated that conventional computing systems are not sufficiently fast to keep up with the ever increasing demand for data throughput in modern applications. Conventional electronic processors face severe speed and efficiency limitations primarily due to the inherent presence of parasitic capacitance in electrical interconnects. Every wire and transistor in the circuits of an electrical processor has a resistance, an inductance, and a capacitance that cause propagation delay and power dissipation in any electrical signal. For example, connecting multiple processor cores and/or connecting a processor core to a memory uses a conductive trace with a non-zero impedance. Large values of impedance limit the maximum rate at which data can be transferred through the trace with a negligible bit error rate. Most conventional processors cannot support clock frequencies in excess of 2-3 GHz.

In applications where time delay is crucial, such as high frequency stock trading, even a delay of a few hundredths of a second can make an algorithm unfeasible for use. For processing that requires billions of operations by billions of transistors, these delays add up to a significant loss of time. In addition to electrical circuits' inefficiencies in speed, the heat generated by the dissipation of energy caused by the impedance of the circuits is also a barrier in developing electrical processors.

In digital computers, the output of a calculation has to completely settle to its final one/zero value prior to being sampled. Otherwise, sampling the output of a calculation before it settles may lead to errors. Typically, a sample is taken once the output of a calculation has gone beyond the linear switching threshold of a transistor, and the next calculation is not started until the previous calculation has completely settled and has been sampled. This limits the throughput in digital computers.

By contrast, analog computers do not operate in the saturated region of the transistors. Instead, analog computers operate on the basis of a continuum of values. Such values must be resolved to a defined level of precision over a certain window of time. Certain analog computers are designed to operate in concert with digital systems (e.g., digital memories and processors). These systems are called hybrid analog-digital computers. A digital system discretizes the output of an analog computer to a total $2^b$ levels, where b is the bit precision of the output. Analog computers are also characterized by a finite bandwidth due to the presence of parasitic capacitance, similar to digital processors. The finite bandwidth increases the time necessary for the output of an analog computer to settle to the desired discretized level. Analog computers having a single-pole response, for example, are characterized by time constant $\tau$, which sets the time scale at which the output signal rises and falls. Typically, the e-folding time (the time necessary for the signal to rise or fall by a factor of e) is used to define this time constant $\tau$. In such systems, it may take multiples of $\tau$ before the signal settles to a value precise to the desired discretization level of $\frac{1}{2}^b$. Performance of such a system is limited if the subsequent calculation is not started until the previous calculation has settled to a level of $\frac{1}{2}^b$ of the final value. However, if a new calculation is begun too soon, interference between the two overlapping calculations arises, which could result in the sampling of wrong output (an effect referred to herein as "inter-calculation-interference").

Thus, conventional computers, whether digital or analog in nature, suffer from limited throughput.

The inventors have developed techniques to improve the data throughput of hybrid analog-digital computing systems. The techniques developed by the inventors and described herein involve launching a new set of operands before the previous set of operands has settled to a level of $\frac{1}{2}^b$ of the final value. This can be accomplished in some embodiments using digital equalization. Digital equalization involves inverting the channel characteristic of an analog processor in such a way that the received signal settles more quickly, thereby allowing for disambiguation of inter-calculation-interference. Digital equalization may be performed on the transmitter side of the calculation, one the receiver side of the calculation (or both). Several types of digital equalization techniques may be used, including but not limited to pre-emphasis, continuous time linear equalization (CTLE) and discrete feedback equalization (DFE). Processors leveraging the digital equalization techniques described herein may be fast enough to support clock frequencies in excess of 10 Ghz, 15 GHz or even 20 GHz, which represents a substantial improvement over conventional processors.

II. Photonic Hybrid Processors

The inventors have recognized and appreciated that using optical signals (instead of, or in combination with, electrical signals) overcomes some of the problems with electronic computing. Optical signals travel at the speed of light in the medium in which the light is traveling. Thus, the latency of optical signals is far less of a limitation than electrical propagation delay. Additionally, no power is dissipated by increasing the distance traveled by the light signals, opening up new topologies and processor layouts that would not be feasible using electrical signals. Thus, photonic processors offer far better speed and efficiency performance than conventional electronic processors.

Some embodiments relate to photonic processors designed to perform machine learning algorithms or other types of data-intensive computations. Certain machine learning algorithms (e.g., support vector machines, artificial neural networks and probabilistic graphical model learning) rely heavily on linear transformations on multi-dimensional arrays/tensors. The simplest linear transformation is a matrix-vector multiplication, which using conventional algorithms has a complexity on the order of $O(N^2)$, where N is the dimensionality of a square matrix being multiplied by a vector of the same dimension. General matrix-matrix (GEMM) operations are ubiquitous in software algorithms, including those for graphics processing, artificial intelligence, neural networks and deep learning. GEMM calculations in today's computers are typically performed using transistor-based systems such as GPUs or systolic array systems.

FIG. 1A is a representation of a matrix-vector multiplication, in accordance with some embodiments. Matrix A is referred to herein as "input matrix" or simply "matrix," and the individual elements of matrix A are referred to herein as "matrix values" or "matrix parameters." Vector X is referred to herein as "input vector," and the individual elements of vector X are referred to as "input value," or simply "inputs." Vector Y is referred to herein as "output vector," and the individual elements of vector Y are referred to as "output values," or simply "outputs." In this example, A is an N×N matrix, though embodiments of the present application are not limited to square matrices or to any specific dimension. In the context of artificial neural networks, matrix A can be a weight matrix, or a block of submatrix of the weight tensor, or an activation (batched) matrix, or a block of submatrix of the (batched) activation tensor, among several possible examples. Similarly, the input vector X can be a vector of the weight tensor or a vector of the activation tensor, for example.

The matrix-vector multiplication of FIG. 1A can be decomposed in terms of scalar multiplications and scalar additions. For example, an output value $y_i$ (where i=1, 2 ... N) can be computed as a linear combination of the input values $x_1, x_2 ... x_N$. Obtaining $y_i$ involves performing scalar multiplications (e.g., $A_{i1}$ times $x_1$, and $A_{i2}$ times $x_2$) and scalar additions (e.g., $A_{i1}x_1$ plus $A_{i2}x_2$). In some embodiments, scalar multiplications, scalar additions, or both, may be performed in the optical domain.

Figure 1B:
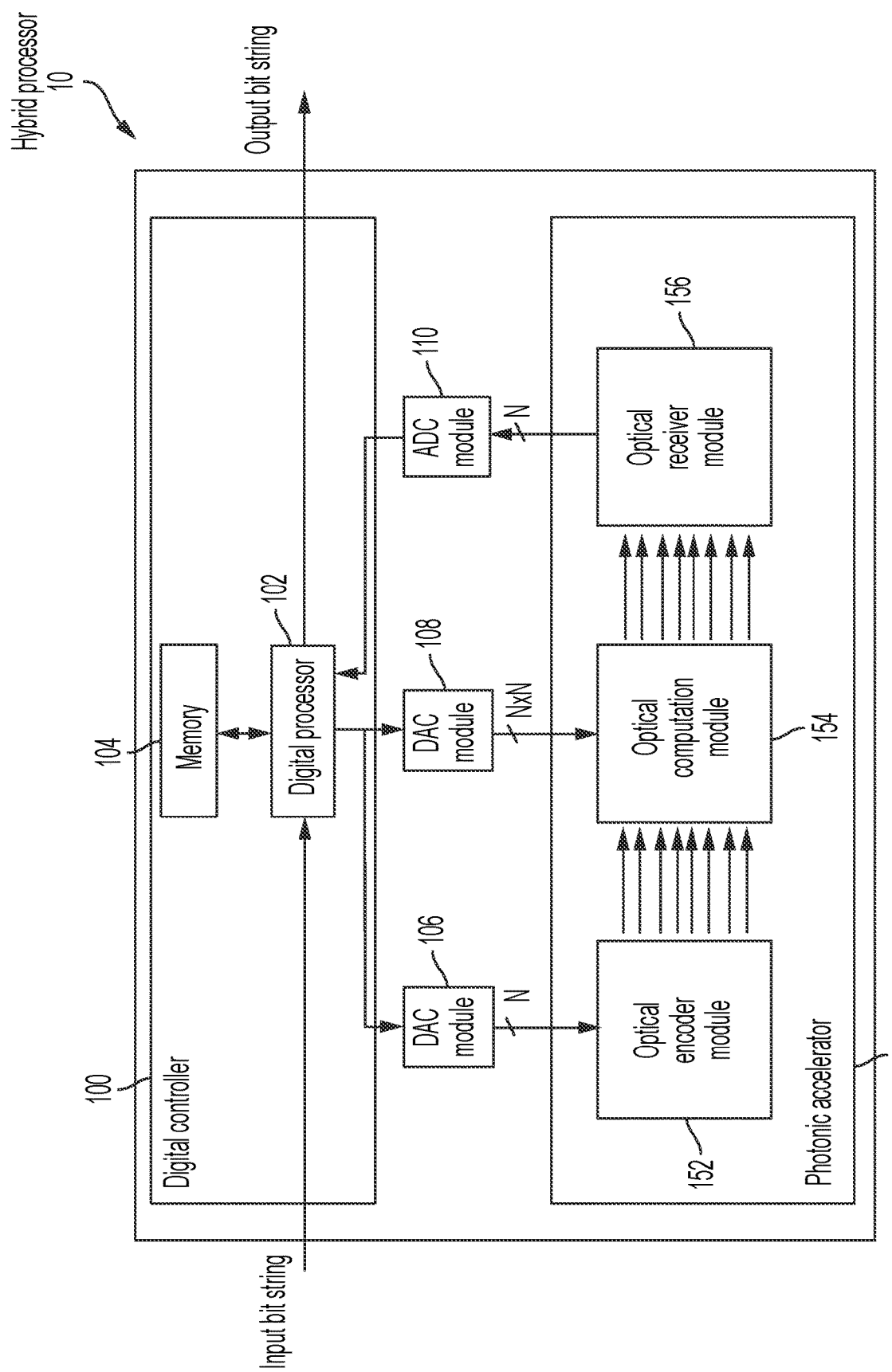
FIG. 1B is a block diagram illustrating a hybrid analog-digital processor configured to perform matrix-vector multiplication, in accordance with some embodiments.

FIG. 1B illustrates a hybrid analog-digital processor 10 implemented using photonic circuits, in accordance with some embodiments. Hybrid processor 10 may be configured to perform matrix-vector multiplications (of the types illustrated in FIG. 1A, for example). Hybrid processor 10 includes a digital controller 100 and a photonic accelerator 150. Digital controller 100 operates in the digital domain and photonic accelerator 150 operates in the analog photonic domain. Digital controller 100 includes a digital processor 102 a memory 104. Photonic accelerator 150 includes an optical encoder module 152, an optical computation module 154 and an optical receiver module 156. Digital-to-analog (DAC) modules 106 and 108 convert digital data to analog signals. Analog-to-digital (ADC) module 110 converts analog signals to digital values. Thus, the DAC/ADC modules provide an interface between the digital domain and the analog domain. In this example, DAC module 106 produces N analog signals (one for each entry of an input vector), DAC module 108 produces N×N analog signals (one for each entry of a matrix), and ADC module 110 receives N analog signals (one for each entry of an output vector). Although matrix A is square in this example, it may be rectangular in some embodiments, such that the size of the output vector differs from the size of the input vector.

Hybrid processor 10 receives, as an input from an external processor (e.g., a CPU), an input vector represented by a group of input bit strings and produces an output vector represented by a group of output bit strings. For example, if the input vector is an N-dimensional vector, the input vector may be represented by N separate bit strings, each bit string representing a respective component of the vector. The input bit string may be received as an electrical signal from the external processor and the output bit string may be transmitted as an electrical signal to the external processor. In some embodiments, digital processor 102 does not necessarily output an output bit string after every process iteration. Instead, the digital processor 102 may use one or more output bit strings to determine a new input bit stream to feed through the components of the hybrid processor 10. In some embodiments, the output bit string itself may be used as the input bit string for a subsequent iteration of the process implemented by the hybrid processor 10. In other embodiments, multiple output bit streams are combined in various ways to determine a subsequent input bit string. For example, one or more output bit strings may be summed together as part of the determination of the subsequent input bit string.

DAC module 106 is configured to convert the input bit strings into analog signals. The optical encoder module 152 is configured to convert the analog signals into optically encoded information to be processed by the optical computation module 154. The information may be encoded in the amplitude, phase and/or frequency of an optical pulse. Accordingly, optical encoder module 152 may include optical amplitude modulators, optical phase modulators and/or optical frequency modulators. In some embodiments, the optical signal represents the value and sign of the associated bit string as an amplitude and a phase of an optical pulse. In some embodiments, the phase may be limited to a binary choice of either a zero phase shift or a $\pi$ phase shift, representing a positive and negative value, respectively. Embodiments are not limited to real input vector values. Complex vector components may be represented by, for example, using more than two phase values when encoding the optical signal.

The optical encoder module 152 outputs N separate optical pulses that are transmitted to the optical computation module 154. Each output of the optical encoder module 152 is coupled one-to-one to an input of the optical computation module 154. In some embodiments, the optical encoder module 152 may be disposed on the same substrate as the optical computation module 154 (e.g., the optical encoder module 152 and the optical computation module 154 are on the same chip). In such embodiments, the optical signals may be transmitted from the optical encoder module 152 to the optical computation module 154 in waveguides, such as silicon photonic waveguides. In other embodiments, the optical encoder module 152 may be disposed on a separate substrate from the optical computation module 154. In such embodiments, the optical signals may be transmitted from the optical encoder module 152 to optical computation module 154 with optical fibers.

The optical computation module 154 performs the multiplication of an input vector X by a matrix A. In some embodiments, optical computation module 154 includes multiple optical multipliers each configured to perform a scalar multiplication between an entry of the input vector and an entry of matrix A in the optical domain. Optionally, optical computation module 154 may further include optical adders for adding the results of the scalar multiplications to one another in the optical domain. Alternatively, the additions may be performed in electrically. For example, optical receiver module 156 may produce a voltage resulting from the integration (over time) of a photocurrent received from a photodetector.

The optical computation module 154 outputs N separate optical pulses that are transmitted to the optical receiver module 156. Each output of the optical computation module 154 is coupled one-to-one to an input of the optical receiver module 156. In some embodiments, the optical computation module 154 may be disposed on the same substrate as the optical receiver module 156 (e.g., the optical computation module 154 and the optical receiver module 156 are on the same chip). In such embodiments, the optical signals may be transmitted from the optical computation module 154 to the optical receiver module 156 in silicon photonic waveguides. In other embodiments, the optical computation module 154 may be disposed on a separate substrate from the optical receiver module 156. In such embodiments, the optical signals may be transmitted from the photonic processor 103 to the optical receiver module 156 using optical fibers.

The optical receiver module 156 receives the N optical pulses from the optical computation module 154. Each of the optical pulses is then converted to an electrical analog signal. In some embodiments, the intensity and phase of each of the optical pulses is detected by optical detectors within the optical receiver module. The electrical signals representing those measured values are then converted into the digital domain using ADC module 110, and provided back to the digital processor 102.

The digital processor 102 controls the optical encoder module 152, the optical computation module 154 and the optical receiver module 156. The memory 104 may be used to store input and output bit strings and measurement results from the optical receiver module 156. The memory 104 also stores executable instructions that, when executed by the digital processor 102, control the optical encoder module 152, optical computation module 154 and optical receiver module 156. The memory 104 may also include executable instructions that cause the digital processor 102 to determine a new input vector to send to the optical encoder based on a collection of one or more output vectors determined by the measurement performed by the optical receiver module 156. In this way, the digital processor 102 can control an iterative process by which an input vector is multiplied by multiple matrices by adjusting the settings of the optical computation module 154 and feeding detection information from the optical receiver module 156 back to the optical encoder module 152. Thus, the output vector transmitted by the hybrid processor 10 to the external processor may be the result of multiple matrix multiplications, not simply a single matrix multiplication.

Figure 2:
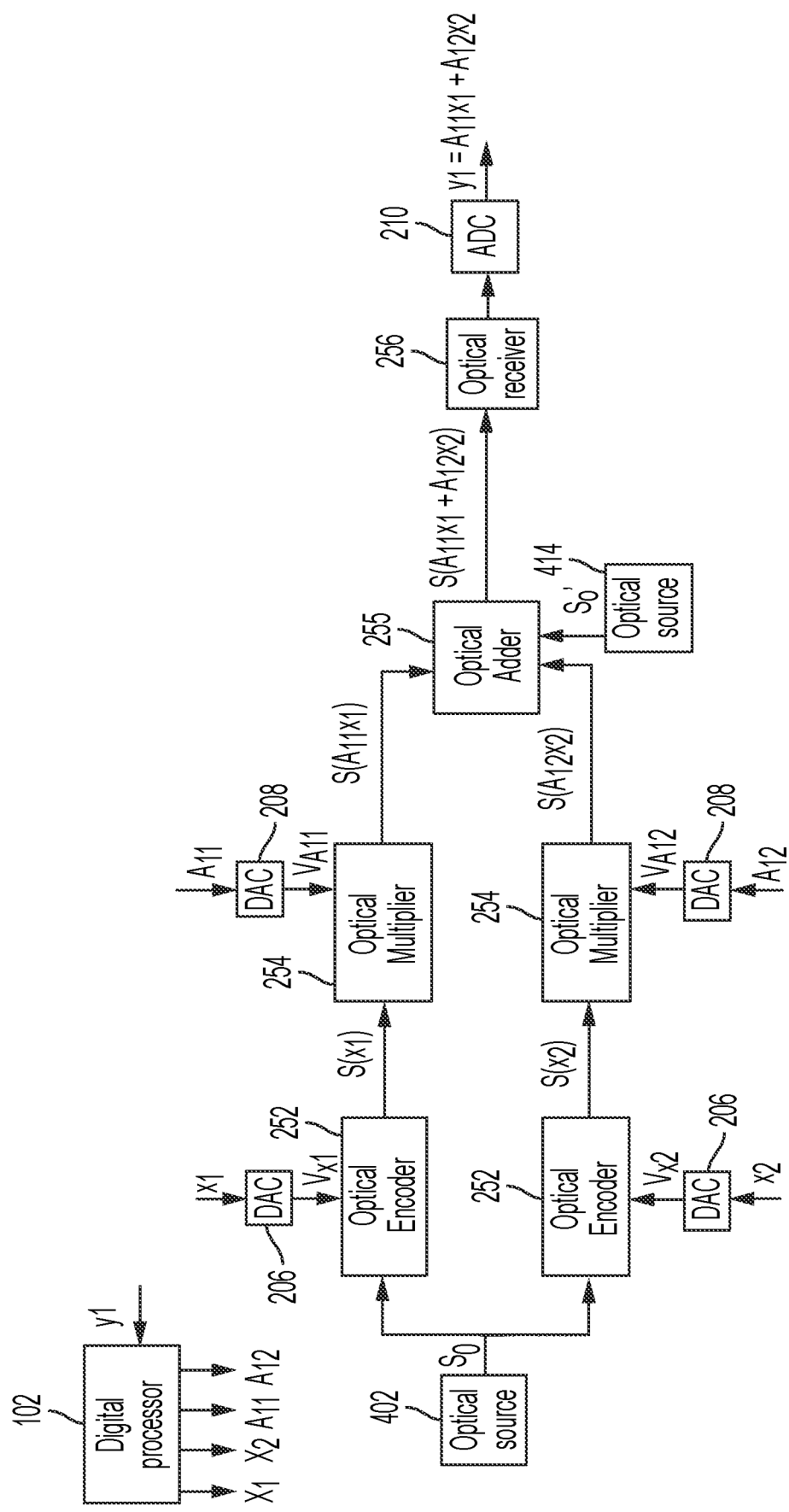
FIG. 2 is a block diagram illustrating a portion of the photonic accelerator of FIG. 1B, in accordance with some embodiments.

FIG. 2 illustrates a portion of photonic accelerator 150 in additional detail, in accordance with some embodiments. More specifically, FIG. 2 illustrates the circuitry for computing $y_1$, the first entry of output vector Y. For simplicity, in this example, the input vector has only two entries, $x_1$ and $x_2$. However, the input vector may have any suitable size.

DAC module 106 includes DACs 206, DAC module 108 includes DACs 208, and ADC module 110 includes ADC 210. DACs 206 produce electrical analog signals (e.g., voltages or currents) based on the value that they receive. For example, voltage $V_{X1}$ represents value $x_1$, voltage $V_{X2}$ represents value $x_2$, voltage Vail represents value $A_{11}$, and voltage $V_{A12}$ represents value $A_{12}$. Optical encoder module 152 includes optical encoders 252, optical computation module 154 includes optical multipliers 154 and optical adder 255, and optical receiver module 156 includes optical receiver 256.

Optical source 402 produces light $S_0$. Optical source 402 may be implemented in any suitable way. For example, optical source 402 may include a laser, such as an edgeemitting laser of a vertical cavity surface emitting laser (VCSEL), examples of which are described in detail further below. In some embodiments, optical source 402 may be configured to produce multiple wavelengths of light, which enables optical processing leveraging wavelength division multiplexing (WDM), as described in detail further below. For example, optical source 402 may include multiple laser cavities, where each cavity is specifically sized to produce a different wavelength.

The optical encoders 252 encode the input vector into a plurality of optical signals. For example, one optical encoder 252 encodes input value $x_1$ into optical signal $S(x_1)$ and another optical encoder 252 encodes input value $x_2$ into optical signal $S(x_2)$. Input values $x_1$ and $x_2$, which are provided by digital processor 102, are digital signed real numbers (e.g., with a floating point or fixed point digital representation). The optical encoders modulate light $S_0$ based on the respective input voltage. For example, optical encoder 404 modulates amplitude, phase and/or frequency of the light to produce optical signal $S(x_1)$ and optical encoder 406 modulates the amplitude, phase and/or frequency of the light to produce optical signal $S(x_2)$. The optical encoders may be implemented using any suitable optical modulator, including for example optical intensity modulators. Examples of such modulators include Mach-Zehnder modulators (MZM), Franz-Keldysh modulators (FKM), resonant modulators (e.g., ring-based or disc-based), nano-electro-electro-mechanical-system (NOEMS) modulators, etc.

The optical multipliers are designed to produce signals indicative of a product between an input value and a matrix value. For example, one optical multiplier 254 produces a signal $S(A_{11}x_1)$ that is indicative of the product between input value $x_1$ and matrix value $A_{11}$ and another optical multiplier 254 produces a signal $S(A_{12}x_2)$ that is indicative of the product between input value $x_2$ and matrix value Au. Examples of optical multipliers include Mach-Zehnder modulators (MZM), Franz-Keldysh modulators (FKM), resonant modulators (e.g., ring-based or disc-based), nano-electro-electro-mechanical-system (NOEMS) modulators, etc. In one example, an optical multiplier may be implemented using a modulatable detector. Modulatable detectors are photodetectors having a characteristic that can be modulated using an input voltage. For example, a modulatable detector may be a photodetector with a responsivity that can be modulated using an input voltage. In this example, the input voltage (e.g., $V_{A11}$) sets the responsivity of the photodetector. The result is that the output of a modulatable detector depends not only on the amplitude of the input optical signal but also on the input voltage. If the modulatable detector is operated in its linear region, the output of a modulatable detector depends on the product of the amplitude of the input optical signal and the input voltage (thereby achieving the desired multiplication function).

Optical adder 412 receives electronic analog signals $S(A_{11}x_1)$ and $S(A_{12}x_2)$ and light $S_0'$ (generated by optical source 414), and produces an optical signal $S(A_{11}x_1+A_{12}x_2)$ that is indicative of the sum of $A_{11}x_1$ with $A_{12}x_2$.

Optical receiver 256 generates an electronic digital signal indicative of the sum $A_{11}x_1+A_{12}x_2$ based on the optical signal $S(A_{11}x_1+A_{12}x_2)$. In some embodiments, optical receiver 256 includes a coherent detector and a transimpedance amplifier. The coherent detector produces an output that is indicative of the phase difference between the waveguides of an interferometer. Because the phase difference is a function of the sum $A_{11}x_1+A_{12}x_2$, the output of the coherent detector is also indicative of that sum. The ADC converts the output of the coherent receiver to output value $y_1=A_{11}x_1+A_{12}x_2$. Output value $y_1$ may be provided as input back to digital processor 102, which may use the output value for further processing.

III. Digital Equalization

The inventors have recognized and appreciated that hybrid light-based processors of the types described in the previous section, despite being substantially faster than conventional fully digital processors, suffer from limited bandwidth. Hybrid light-based processors of the types described herein are faster than fully digital processors because some of the conductive traces are replaced by optical waveguides, and optical waveguides do not suffer from parasitic capacitance. Nonetheless, these hybrid light-based processors still include some conductive traces for supporting electrical signals that control the operations of the photonic processors. Such conductive traces, unfortunately, exhibit parasitic capacitance. The longer the conductive traces, the larger the parasitic capacitance and the lower the bandwidth of the hybrid light-based processor. For example, an electrical path that is 1 cm or longer may limit the bandwidth of the processor to less than 3 GHz. FIG. 3A illustrates a representative amplitude response of a hybrid processor as a function of frequency. In this example, the hybrid processor exhibits a single-pole response with a bandwidth between 2 GHz and 3 GHz.

Figure 3B:
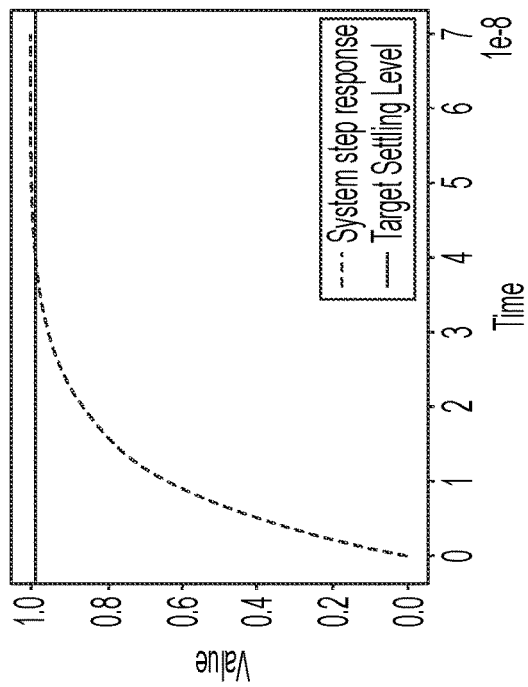
FIGS. 3B-3C are plots illustrating representative time-domain responses of a photonic accelerator, in accordance with some embodiments.

The effect of having such a response is illustrated in FIG. 3B, which illustrates the time-domain response of a hybrid processor, in accordance with some embodiments. This plot illustrates the target settling level (the final desired level) and the processor's actual response as a function of time. The processor's limited bandwidth results in the response taking several nanoseconds before reaching the desired level. The characteristic time constant τ, which is inversely proportional to the processor's bandwidth, sets the rate at which the output signal rises and falls. Typically, the e-folding time (the time for the signal to rise or fall by a factor of e) is used to define this time constant τ. In such systems, it may take multiples of τ before the signal settles to a value precise to the desired discretization level of $\frac{1}{2}^b$ (where b represents the bit precision). Performance of such a system is limited if the subsequent calculation is not started until the previous calculation has settled to a level of $\frac{1}{2}^b$ of the final value. However, if a new calculation is begun too soon, interference between the two overlapping calculations arises, which could result in inter-calculation-interference.

Figure 3C:
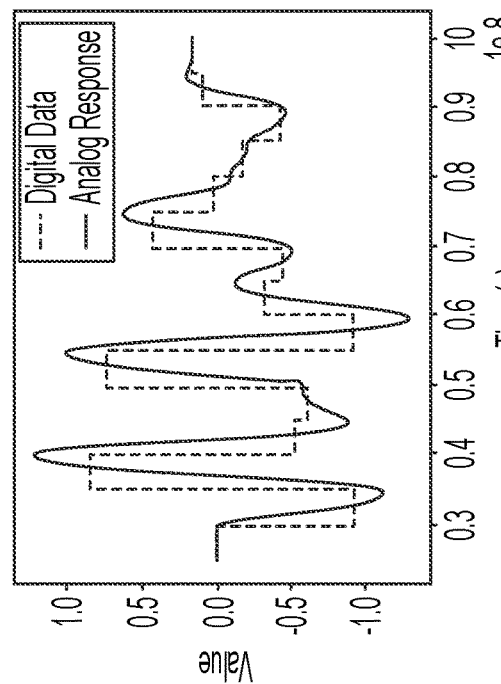
Figure 3A:
FIG. 3A is a plot illustrating a representative frequency response of a photonic accelerator, in accordance with some embodiments.

FIG. 3C is a plot illustrating the analog response of a hybrid processor and the digital data for a non-return-to-zero encoded output, as a function of time, in accordance with some embodiments. As shown in the figure, the analog response does not vary fast enough to be able to precisely replicate the level of the digital data, which can lead to errors.

The inventors have developed techniques that allow launching a new set of operands before the previous set of operands has settled to the final value. The techniques developed by the inventors involves determining the channel characteristics of the hybrid processor (e.g., the frequency response of a particular signal path of the hybrid processor) and equalizing the channel characteristics to extend the bandwidth of the hybrid processor. Channel equalization allows the received signal to settle more quickly, thereby allowing for disambiguation of inter-calculation-interference. In some embodiments, channel equalization may be performed using digital filters. Several types of digital equalization techniques may be used, including but not limited to pre-emphasis, continuous time linear equalization (CTLE) and discrete feedback equalization (DFE). Processors leveraging the digital equalization techniques described herein may be fast enough to support clock frequencies in excess of 10 GHz, 15 GHz or even 20 GHz, which represents a substantial improvement over conventional processors.

Figure 4:
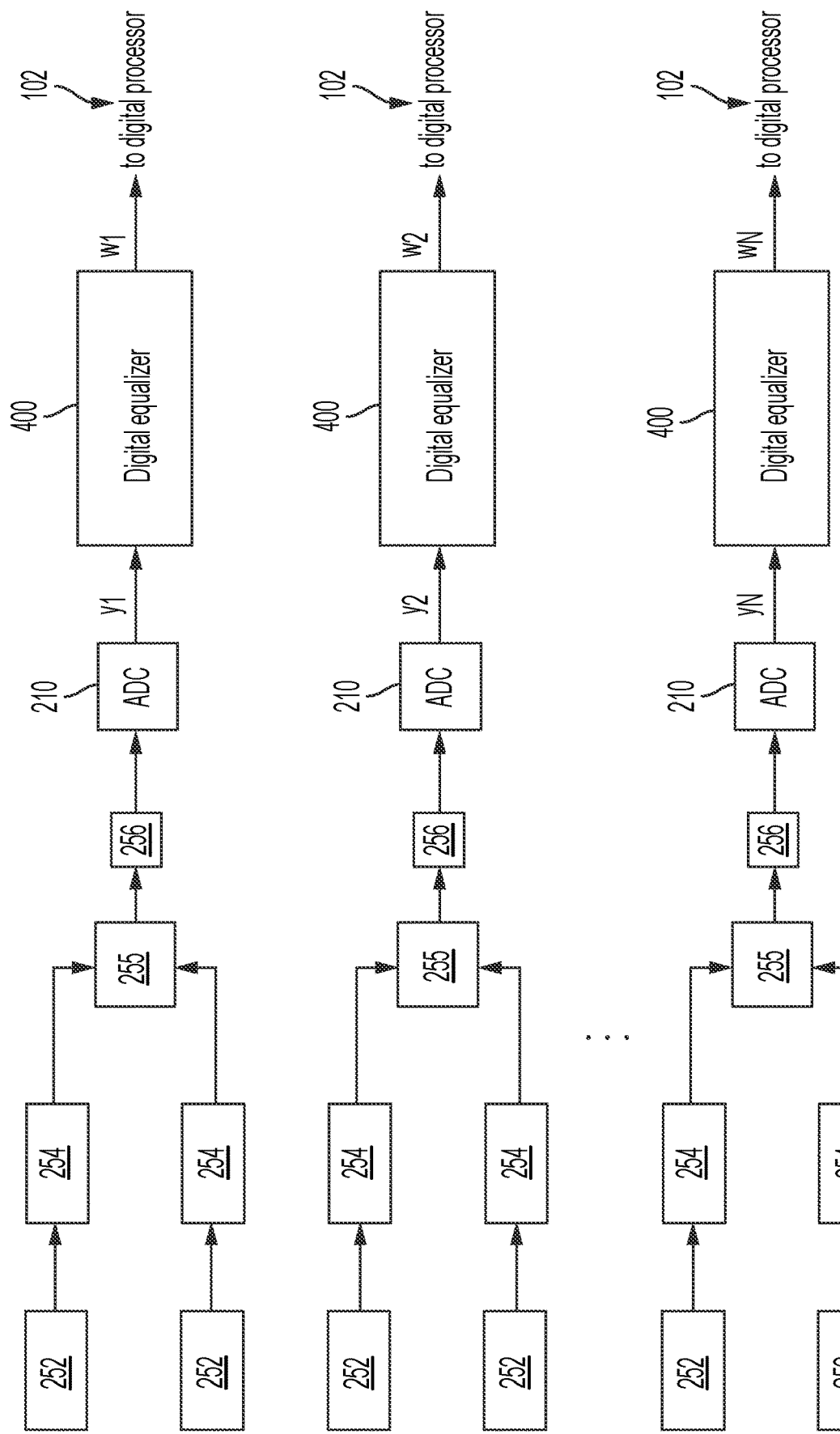
FIG. 4 is a block diagram illustrating a photonic accelerator including a plurality of digital equalizers, in accordance with some embodiments.

FIG. 4 is a block diagram of a portion of a photonic accelerator including a plurality of channels, in accordance with some embodiments. In this example, each channel is arranged in the manner discussed in connection with FIG. 2. Thus, each channel includes two or more optical encoders 252, two or more optical multipliers 254, an optical adder 255, an optical receiver 256 and an ADC 210. In some embodiments, a photonic accelerator may be designed to perform matrix-vector multiplication over very large matrices, for example in the order of 256×256, 512×512, or 1024×1024 (thought the matrix need not be square). In these example, a photonic accelerator may include 256, 512 or 1024 channels, one channel for each row of the matrix.

Figure 5A:
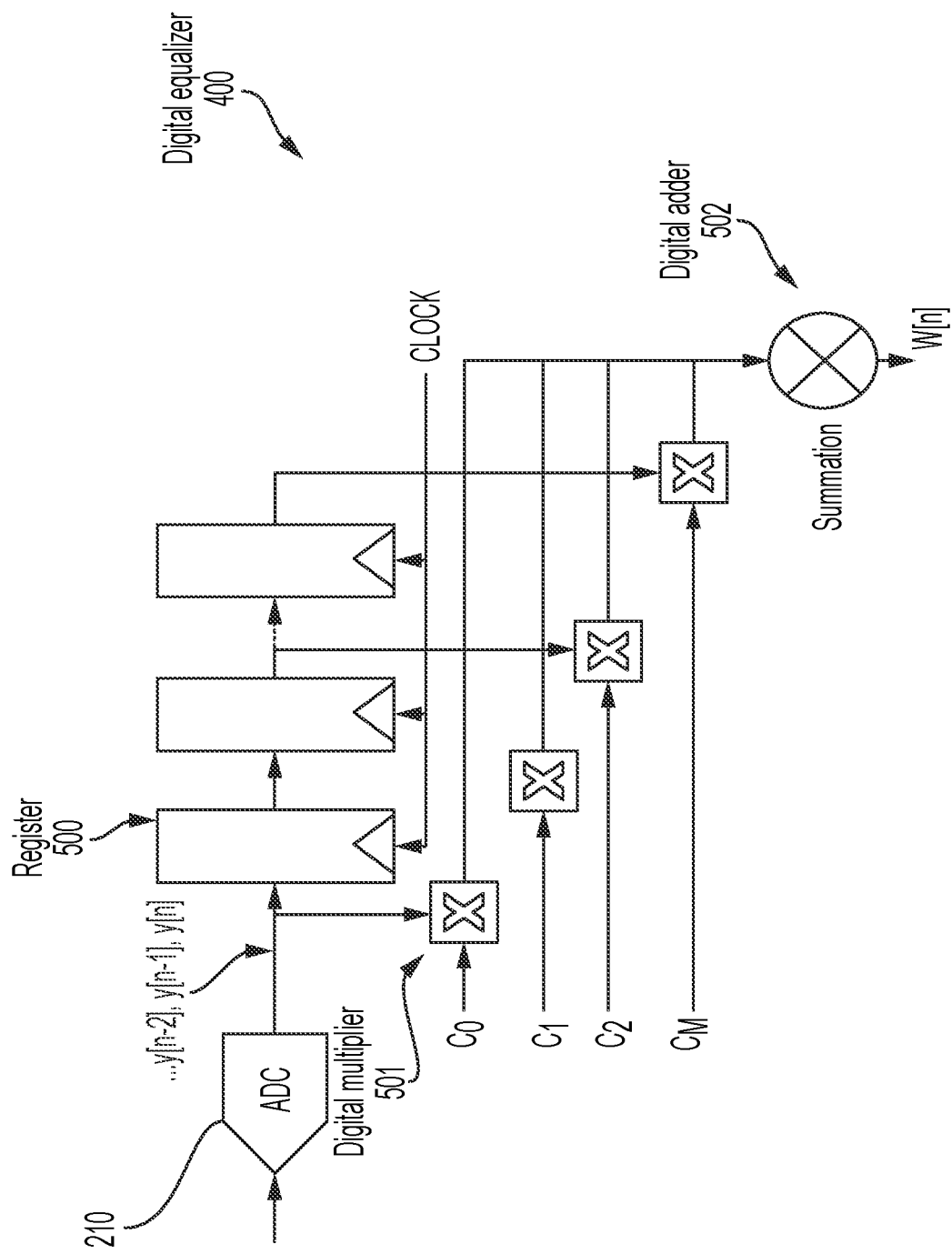
FIG. 5A is a block diagram illustrating a representative implementation of a digital equalizer, in accordance with some embodiments.

Each channel includes a digital equalizer 400 coupled to the output of the ADC. The inputs to the equalization channels are identified as y[n] (where n=1, 2 . . . N is the discretized time variable), and the outputs as w[n]. In some embodiments, an equalization channel 400 generates output w[n] by calculating a linear combination of the previous state samples y[n], y[n−1], y[n−2], etc. The linear combination can be expressed as follows:

$$w[n] = \sum_{i=0}^{M} c_i y[n-i]$$

where $c_i$ is a coefficient (whether real or complex) representing the channel response. Here, M determines how many previous state samples y[n] are used to implement the equalization. Where M is a finite number, digital equalizer 400 implements a finite impulse response (FIR) filter. In other embodiments, however, a digital equalizer 400 may implement an infinite impulse response (IIR) filter. Each state sample y[n−i] corresponds to a past (where i>0) or current (where i=0) digitization of the amplitude of the analog signal, and w[n] corresponds to the calculated steady-state output value for the current set of digital inputs. FIG. 5A is a block diagram illustrating a digital equalizer 400 that implements such a linear combination, in accordance with some embodiments. In this example, digital equalizer 400 includes a plurality of registers 500, a plurality of digital multipliers 501 and a digital adder 502. Each register 500 records the state sample (y) at a different time. For example, one register may record y[n−1], another register may record y[n−2], etc. The registers allow digital equalizer 400 to remember the historical state samples. Digital multipliers 501 multiply a state sample to a corresponding coefficient. One of the digital multipliers, for example, may multiply coefficient $c_1$ times state sample y[n−1]. Digital adder 502 adds the results of the digital multiplications to one another. As a result, output w[n] represents a linear combination of the historical state samples.

The coefficients $c_i$ may be determined in any of numerous ways based on the characteristics of the channel of the hybrid processor. In some embodiments, the coefficients $c_i$ may be obtained by exciting the hybrid processor with a known excitation, and by sampling the output at the desired rate. In some such embodiments, the coefficients can be calculated based on the following expression (though the last coefficient should be chosen so that the sum of all the coefficients equals 1):

$$c_i = \left(\frac{1}{y_1}\right)\left(1 - \sum_{m=1}^{i} c_{m-1} y_{2+i-m}\right)$$

Figure 5B:
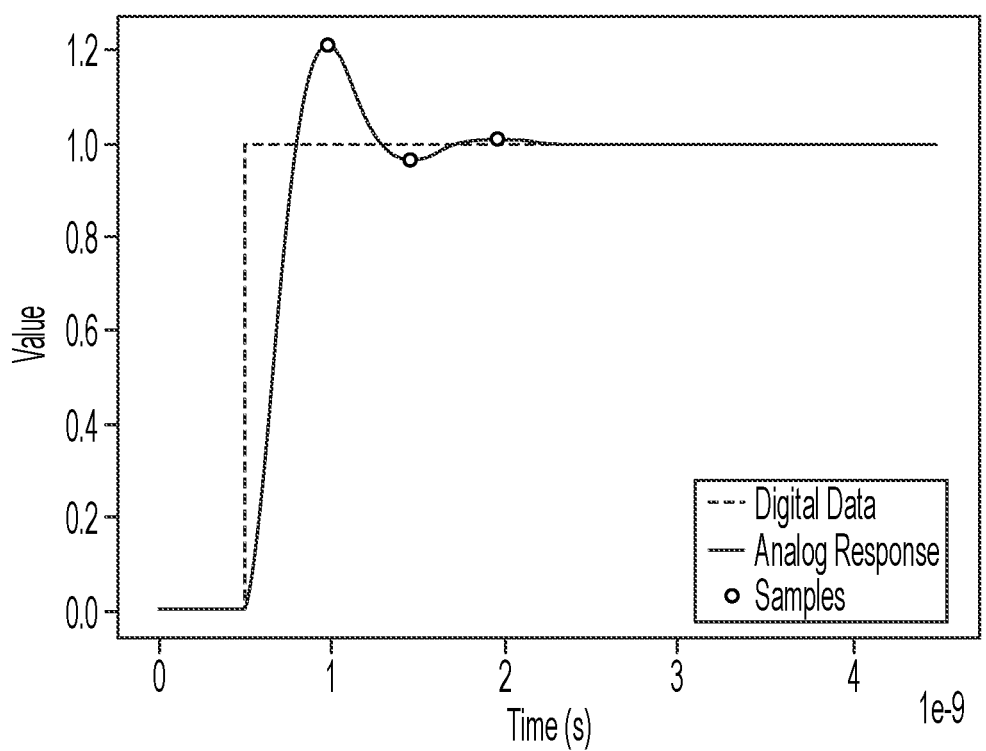
FIG. 5B is a plot illustrating a representative time-domain response of a digital equalizer, in accordance with some embodiments.

In some embodiments, the known excitation may be a step signal. FIG. 5B is a plot illustrating a step signal excitation (digital data) and the corresponding analog response. In this particular example, the digital equalizer records three samples, and based on those three samples, obtains the following $c_i$ coefficients: 0.834, 0.167 and −0.001.

Figure 5C:
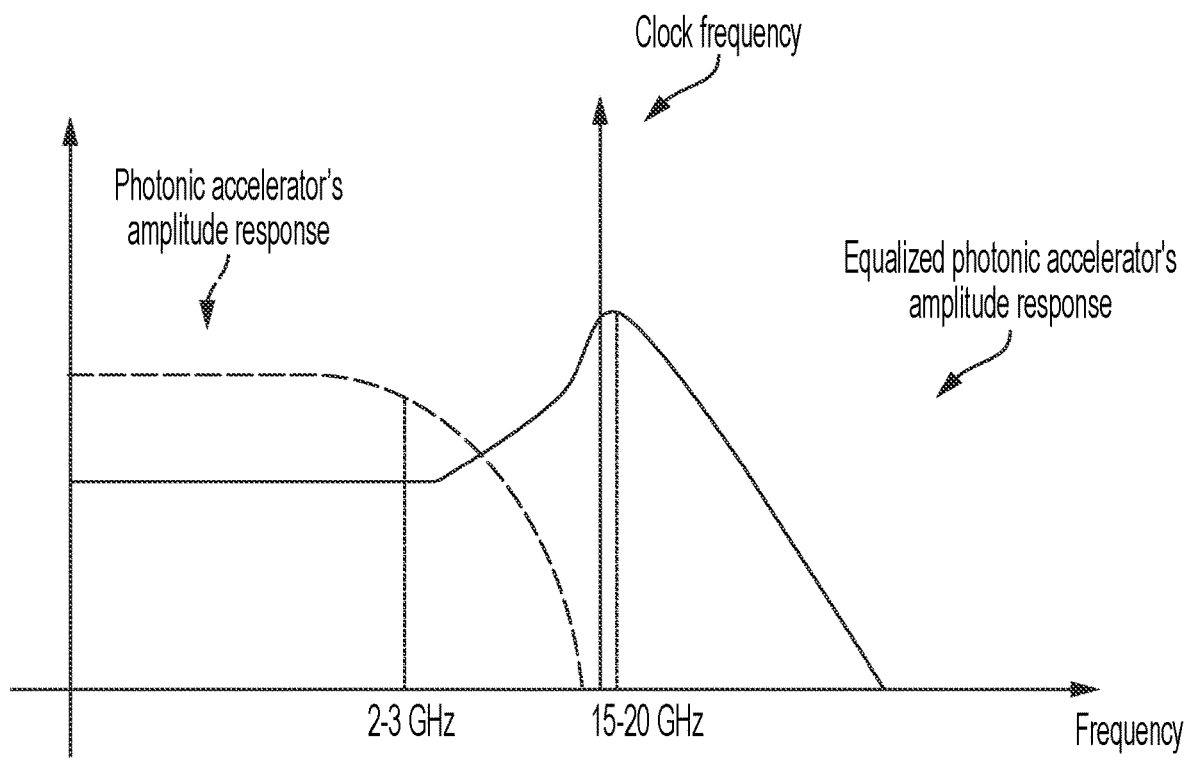
FIG. 5C is a plot illustrating a representative frequency response of a photonic accelerator with and without equalization, in accordance with some embodiments.

In some embodiments, a digital equalizer may suppress the low frequency components of the output signal and may amplify the higher frequency components. This results in a greater time-domain separation of the potentially interfering calculations and thus the ability to run calculations at a significantly higher rate. FIG. 5C is a plot illustrating the amplitude response of a photonic accelerator with and without equalization, in accordance with some embodiments. As shown in this figure, the response of the non-equalized photonic accelerator exhibits a bandwidth (e.g., 3 dB bandwidth) between 2 GHz and 3 GHz. The limited bandwidth may be due for example to the parasitic capacitance present in the circuitry controlling the photonic accelerator. The digital equalizer suppresses the low frequencies and amplifies the higher frequencies (in this example, with a peak between 15 GHz and 20 GHz). As a result, the equalized photonic accelerator exhibits a bandwidth that is larger that the bandwidth without equalization. For example, the bandwidth of the equalized photonic accelerator may be between 10 GHz and 30 GHz. Leveraging the bandwidth extension obtained thanks to the digital equalization, the hybrid processor may be timed using a clock having a frequency that is greater than the bandwidth of the non-equalized photonic accelerator while allowing for disambiguation of inter-calculation-interference. FIG. 5C further illustrates a clock having a frequency between the bandwidth of the non-equalized photonic accelerator and the bandwidth of the equalized photonic accelerator.

It should be appreciated that the equalization function that generates w[n] need not to be a linear function. In some embodiments. The equalization function can be nonlinear. In some embodiments, a digital equalizer may be designed to implement a discrete linear time-invariant system and to convert the transfer function to a linear constant-coefficient difference equation by means of z-transform. Consider the transfer function:

$$H(z) = W(z)/Y(z) = \sum_{k=0}^{M} z^{-k} b_k \Big/ \sum_{i=0}^{N} z^{-i} a_i$$

Using this transfer function, the equalizer can be represented by a difference equation (using the inverse z-transform):

$$y[n] = -\sum_{k=1}^{M} b_k y[n-k] + \sum_{i=0}^{N} a_i x[n-i]$$

where $a_i$ represents the feed-forward coefficients (for propagation from the input to the output) and $b_k$ represents the feed-backward coefficients (for propagation from the input to the output). The choice of the appropriate transfer function depends on the analog system the output values of which we to be predicted, and this transfer function can be measured by identifying the zeros and the poles of the system.

IV. Additional Comments

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The definitions, as defined and used herein, should be understood to control over dictionary definitions, definitions in documents incorporated by reference and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some case and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±20% of a target value in some embodiments. The terms "approximately," "substantially," and "about" may include the target value.

Use of ordinal terms such as "first," "second," "third," etc., in the claims to modify a claim element does not by itself connotate any priority, precedence, or order of one claim element over another or the temporal order in which acts of a method are performed, but are used merely as labels to distinguish one claim element having a certain name from another claim element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A hybrid analog-digital processing system comprising:
   a photonic accelerator configured to perform matrix-vector multiplication using light, wherein the photonic accelerator exhibits a frequency response having a first bandwidth;
   a plurality of analog-to-digital converters (ADCs) coupled to the photonic accelerator; and
   a plurality of digital equalizers coupled to the plurality of ADCs, wherein the digital equalizers are configured to set a frequency response of the hybrid analog-digital processing system to a second bandwidth greater than the first bandwidth.

2. The hybrid analog-digital processing system of claim 1, further comprising clock circuitry configured to time the digital equalizers using a clock having a frequency between the first bandwidth and the second bandwidth.

3. The hybrid analog-digital processing system of claim 1, wherein at least one among the plurality of digital equalizers comprises a plurality of registers configured to store historical samples and to provide an output based at least in part on the historical samples.

4. The hybrid analog-digital processing system of claim 1, wherein the digital equalizers are configured to perform continuous time linear equalization (CTLE).

5. The hybrid analog-digital processing system of claim 1, wherein the digital equalizers comprise finite impulse response (FIR) filters, the FIR filters comprising respective pluralities of coefficients configured to equalize the frequency response of the photonic accelerator.

6. The hybrid analog-digital processing system of claim 5, wherein the respective pluralities of coefficients are determined by passing one or more known inputs through the photonic accelerator.

7. The hybrid analog-digital processing system of claim 6, wherein the known inputs include stepped inputs.

8. The hybrid analog-digital processing system of claim 1, wherein the photonic accelerator comprises at least one electrical path having a length greater than 1 cm, and wherein the first bandwidth is less than 3 GHz.

9. The hybrid analog-digital processing system of claim 1, wherein the second bandwidth is between 10 GHz and 30 GHz.

10. The hybrid analog-digital processing system of claim 1, wherein the digital equalizers are configured to perform discrete feedback equalization (DFE).

11. The hybrid analog-digital processing system of claim 1, wherein the photonic accelerator comprises a plurality of modulatable detectors, and wherein the photonic accelerator is configured to perform matrix-vector multiplication using the plurality of modulatable detectors.

12. The hybrid analog-digital processing system of claim 1, wherein the photonic accelerator comprises a plurality of optical adders, and wherein the photonic accelerator is configured to perform matrix-vector multiplication using the plurality of optical adders.

13. A method for performing a mathematical operation using a hybrid analog-digital processing system comprising a photonic accelerator, the method comprising:
- obtaining a plurality of parameters representing a first matrix;
- obtaining a first plurality of inputs representing a first input vector and obtaining a second plurality of inputs representing a second input vector;
- at a first time, generating a first output vector by performing matrix-vector multiplication using the photonic accelerator based at least in part on the plurality of parameters and the first plurality of inputs;
- at a second time subsequent to the first time, generating a second output vector by performing matrix-vector multiplication using the photonic accelerator based at least in part on the second plurality of inputs; and
- generating an equalized output vector by combining the first output vector with the second output vector.

14. The method of claim 13, wherein combining the first output vector with the second output vector comprises linearly combining the first output vector with the second output vector.

15. The method of claim 14, further comprising determining a plurality of coefficients by passing one or more known inputs through the photonic accelerator, wherein linearly combining the first output vector with the second output vector comprises linearly combining the first output vector with the second output vector using the plurality of coefficients.

16. The method of claim 15, wherein passing one or more known inputs through the photonic accelerator comprises passing one or more stepped inputs through the photonic accelerator.

17. The method of claim 13, further comprising clocking the hybrid analog-digital processing system using a clock having a frequency greater than a bandwidth of the photonic accelerator.

18. The method of claim 17, wherein the bandwidth is less than 3 GHz, and the frequency of the clock is between 10 GHz and 30 GHz.

19. The method of claim 13, wherein combining the first output vector with the second output vector comprises performing continuous time linear equalization (CTLE).

20. The method of claim 13, wherein combining the first output vector with the second output vector comprises performing discrete feedback equalization (DFE).

21. The method of claim 13, wherein performing matrix-vector multiplication using the photonic accelerator comprises performing matrix-vector multiplication using a plurality of modulatable detectors.

* * * * *